US006654941B1

(12) United States Patent
Baumbach

(10) Patent No.: US 6,654,941 B1
(45) Date of Patent: Nov. 25, 2003

(54) BUS I/O PLACEMENT GUIDANCE

(75) Inventor: Jason G. Baumbach, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/998,675

(22) Filed: Nov. 30, 2001

(51) Int. Cl.[7] ............................. G06F 17/50; G06F 9/45
(52) U.S. Cl. ......................... 716/10; 716/6; 716/7; 716/8; 716/12; 716/16; 716/17
(58) Field of Search ........................ 716/1–21; 712/39, 712/37; 711/172; 709/232; 703/26, 23, 14; 361/786, 767; 326/41, 39

(56) References Cited

U.S. PATENT DOCUMENTS 5,128,871 A * 7/1992 Schmitz ................ 716/17
5,983,277 A * 11/1999 Heile et al. ............ 709/232

OTHER PUBLICATIONS

PCI Local Bus Specification, Revision 2.2, Dec. 18, 1998, pp. 1–302.

* cited by examiner

Primary Examiner—Vuthe Siek
Assistant Examiner—Y Rossoshek
(74) Attorney, Agent, or Firm—Christopher P. Maiorana, P.C.

(57) ABSTRACT

A method for relative pin placement guidance, comprising the steps of (A) placing a plurality of pins to form a pinout in response to a first design, a second design and an attribute and (B) determining one or more placement constraints, one or more groups of the pins, and routing of the pins in response to the attribute.

19 Claims, 5 Drawing Sheets

BUS I/O PLACEMENT GUIDANCE

FIELD OF THE INVENTION

The present invention relates to a method and/or architecture for implementing I/O circuitry generally and, more particularly, to a method and/or architecture for placement of bus I/O circuitry.

BACKGROUND OF THE INVENTION

Designers of programmable logic devices (PLDs) need an efficient system to fix pinout designs to printed circuit boards (PCBS). For example, once a PCB is manufactured, Designers typically recompile PLD designs to fit the pinout constraint of the PCB. Furthermore, if the Designer has specific routing guidances to follow (i.e., if the PLD connects to a PCI edge connector or if a data bus connects to an external memory), the Designer is only given control over individual pins. For example, the Designer can only specify the exact location of a limited number of pins.

Conventional technologies for pinout assignment consist of (i) exact specified pin placement, where every I/O pin is uniquely specified and (ii) automatic pin placement, where the pinout is determined by placer software. Such conventional technologies have the following limitations (i) if the Designer allows the placer to define the pinout, PCB routing will be complicated and non-optimal, (ii) if the Designer defines the pinout, the timing of the PLD might not be optimal (i.e., functional success, timing failure), (iii) if the Designer defines the pinout, the PLD design might not fit in the PLD due to fundamental architectural limitations (i.e., functional failure), and (iv) if the Designer defines the pinout and decides to manually iterate multiple pinouts to improve PCB routing and/or timing, critical design time is wasted and the design might not be optimized.

Referring to FIG. 1, a PCB 10 with a PLD 12 connected to a PCI edge connector 14 is shown illustrating undesirable routing. A PCI edge connector is an example of application specific pin placement. A portion of the PCI connector pinout from the PCI specification, Version 2.2 (published December 1998 and hereby incorporated by reference in its entirety) is shown in the following TABLE 1:

TABLE 1

| PIN | 5 V System Environment | |
|---|---|---|
| | Side B | Side A |
| 1 | −12 V | TRST# |
| 2 | TCK | +12 V |
| 3 | Ground | TMS |
| 4 | TDO | TDI |
| 5 | +5 V | +5 V |
| 6 | +5 V | INTA# |
| 7 | INTB# | INTC# |
| 8 | INTD# | +5 V |
| 9 | PRSNT1# | Reserved |
| 10 | Reserved | +5 V$^{(I/O)}$ |
| 11 | PRSNT2# | Reserved |
| 12 | Ground | Ground |
| 13 | Ground | Ground |
| 14 | Reserved | 3.3 Vaux |
| 15 | Ground | RST# |
| 16 | CLK | +5 V$^{(I/O)}$ |
| 17 | Ground | GNT# |
| 18 | REQ# | Ground |
| 19 | +5 V$^{(I/O)}$ | PME# |
| 20 | AD[31] | AD[30] |

TABLE 1-continued

| PIN | 5 V System Environment | |
|---|---|---|
| | Side B | Side A |
| 21 | AD[29] | +3.3 V |
| 22 | Ground | AD[28] |
| 23 | AD[27] | AD[26] |
| 24 | AD[25] | Ground |
| 25 | +3.3 V | AD[24] |
| 26 | C/BE[3]# | IDSEL |
| 27 | AD[23] | +3.3 V |
| 28 | Ground | AD[22] |
| 29 | AD[21] | AD[20] |

PCB Designers attempt to avoid crossovers, while routing the programmable I/O of the PLD 12 to the PCI edge connector 14. Avoiding crossover routing reduces the number of vias, which are impedance discontinuities. Routing without vias allows signal traces to closely approximate a transmission line (i.e., continuous uniform cross-section), since the traces do not cross each other.

Referring to FIG. 2, a segmented I/O architecture 20 is shown. The pinout of a PLD 21 is defined prior to the compilation of the logic inside the PLD 21. Often, the Designer specifies a pinout that does not provide optimum timing performance or is not architecturally compatible with the I/O architecture of the PLD 21. Therefore, some PCI bus signals are in one routing channel (A) and some PCI bus signals are in another routing channel (B). The logic clusters 22a–22n are not able to receive all the PCI bus signals without using the routing switches (C). As a result, the associated timing parameters (i.e., setup, state-to-state, clock-to-output, etc.) are larger (worse) than the maximum performance specifications of the device 20.

Referring to FIG. 3, an I/O block 30 is shown. The output control channel (OCC) 32 is common to each I/O block (i.e., the OCC 32 is a banked resource). Therefore, only two unique logic-driven output enable (OE) conditions can be used in a given I/O block. For example, if a system Designer defines a pinout such that signals connected to an I/O block 30 require three unique logic-driven OE conditions, the placer software will not be able to complete placement of the design. The Designer is then forced to move a portion of the I/O logic 30, and re-try the compilation/placement process.

Referring to FIG. 4, a simplified interface circuit 40 is shown illustrating a desirable I/O mapping. The circuit 40 illustrates a desirable mapping of the framer 42 and the serializer/deserializer (SERDES) 44. The circuit 40 routes the data bus between the PLD 42 and the SERDES 44 by laying the traces in order. However, if the placer software determines the pinout arbitrarily (i.e., if the Designer does not specify any pin constraints), the placement is not guaranteed to be orderly.

Referring to FIG. 5, a simplified interface circuit 50 is shown illustrating an undesirable I/O mapping. The circuit 50 illustrates an undesirable mapping of the framer 52 to the SERDES 54. Since the placer software determined the pinout of the circuit 50 arbitrarily, the system 50 is disorderly. The Designer must correct the design. The Designer can (i) perform PCB layout with traces that cross each other (i.e., use vias extensively) or (ii) change the pinout of the PLD 52 to conform to the pinout of the SERDES device 54. Since vias are to be avoided, the Designer has to individually assign the signals of the PLD 52 to align with the pinout of the SERDES 54. For example, the Designer must specify that the "Data 0" pin connects to "pin 58" and the "Data 1" pin connects to "pin 59".

The assignment process is manual and not efficient. Furthermore, if the Designer encounters an architectural limitation during the assignment process, such as the OCC OE constraint (i.e., the circuit 30), the Designer will have to determine a new pinout that meets the timing requirements, PCB layout requirements, and architectural limitations of the PLD in use.

When the Designer specifies a hard pinout prior to compilation, the placer software must meet timing constraints for a pinout that can be non-optimal from a timing perspective. As a result, the software has less freedom to determine logic placement to meet the timing constraints imposed by the Designer. When the Designer allows the pins to float during compilation, the placer has no pinout guidance and the Designer is forced to route the PCB in a non-optimal manner (i.e., with traces crossing each other).

Current PLD pinout design techniques either (i) define the PLD pinout before the code for the PLD is written or (ii) define the target PLD code and then perform the board layout. In either case, the Designer is forced to move signal assignments one-by-one to optimize the overall design.

It is generally desirable to provide automated bus I/O placement guidance for PLDs on PCBs that optimizes routing and timing at a minimal cost.

SUMMARY OF THE INVENTION

The present invention concerns a method for relative placement guidance, comprising the steps of (A) placing a plurality of pins to form a pinout in response to a first design, a second design and an attribute and (B) determining one or more placement constraints, one or more groups of the pins, and routing of the pins in response to the attribute.

The objects, features and advantages of the present invention include providing a method and/or architecture for automatic placement of bus I/O pins that may (i) simplify PCB routing, (ii) optimize timing, (iii) minimize trace crossovers and vias, (iv) reduce design time and cost, (v) improve design reliability, and/or (vi) automatically overcome architectural constraints.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

As data bus width and bandwidth requirements increase, I/O pin count of programmable logic devices (PLDs) is increasing. For example, current PLDs may have over 1000 (input/output) I/O pins. Large numbers of I/O pins are needed due to wide buses being routed into and out of PLDs. The present invention may also allow I/O buses used in PLDs to match printed circuit board (PCB) routing requirements.

The present invention may provide a method and/or architecture for implementing a programmable logic placer configured to provide relative I/O pinout placement guidance. The present invention may be configured to provide pinout guidance in response to Designer input or other appropriate type input (e.g., software generated). The present invention may not be as strict as specifying exact pin locations or as loose as arbitrarily placing pins (as described in the background section). The present invention may allow the Designer to specify and provide limited placement constraints. The present invention may allow flexibility regarding pin placement specifics. The present invention may satisfy both the timing and architecture requirements of the Designer and the PLD. The present invention may provide such functionality, since the design requirements may be for placement of an I/O pin relative to other I/O pins and not absolute pin placement.

Figure 1:
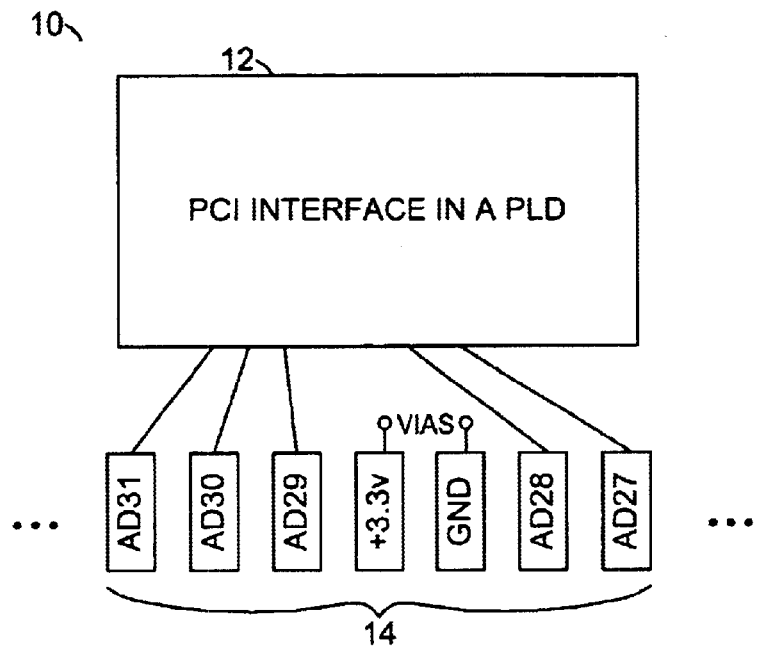
FIG. 1 is a block diagram of a PCI interface-in-a-PLD to PCI edge connector routing circuit.
Figure 2:
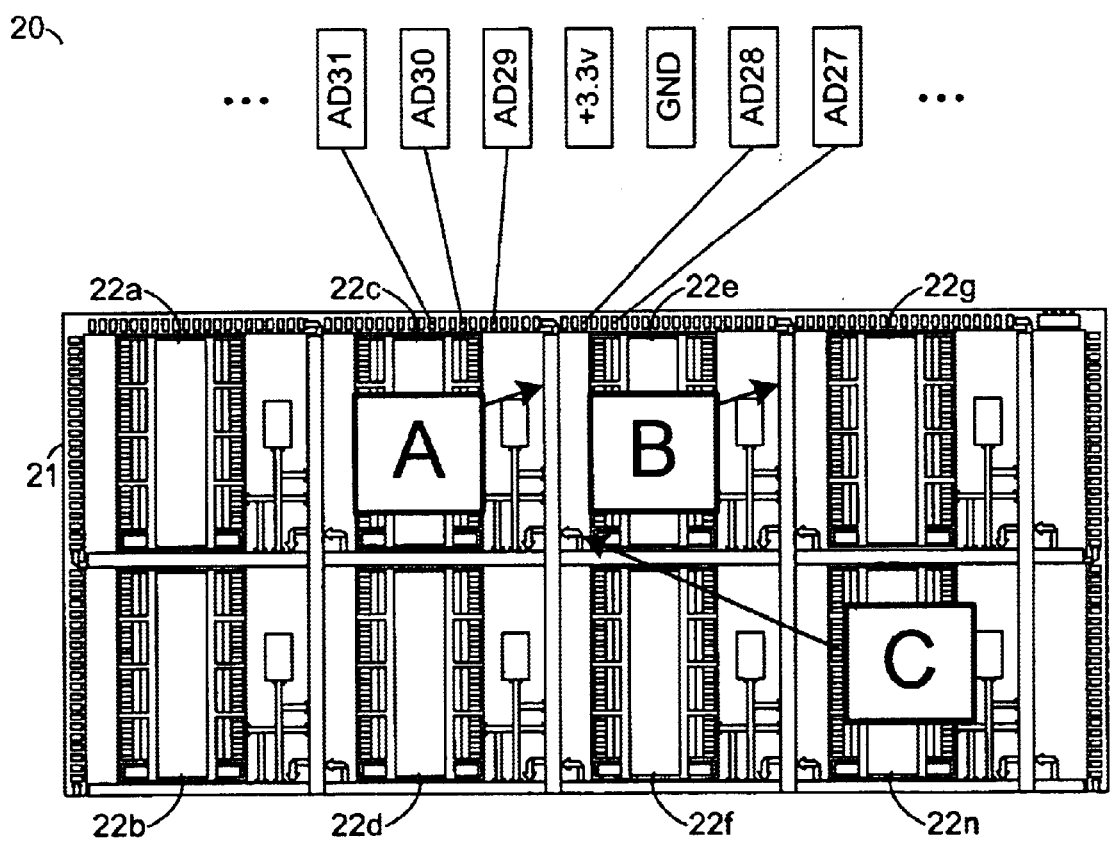
FIG. 2 is a block of a PLD architecture.
Figure 3:
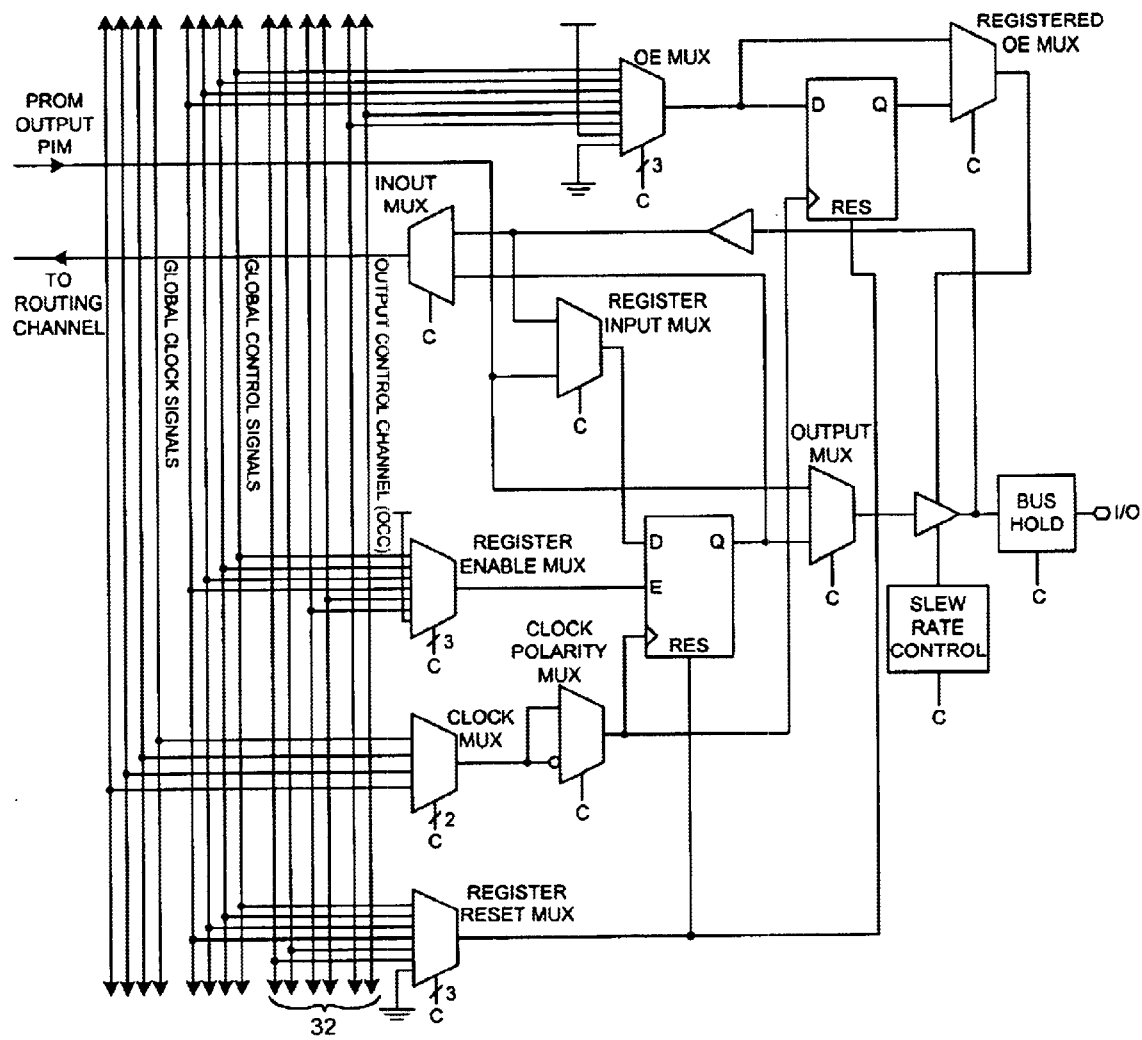
FIG. 3 is a block diagram of the I/O architecture of the circuit of FIG. 2.
Figure 4:
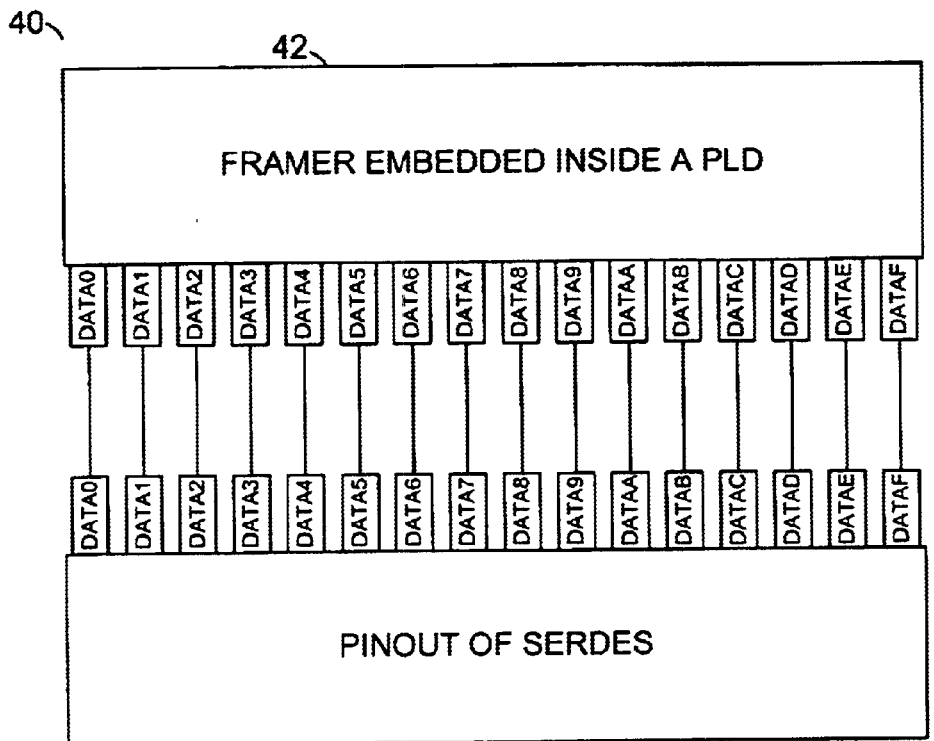
FIG. 4 is a block diagram illustrating a desired interface I/O mapping.
Figure 5:
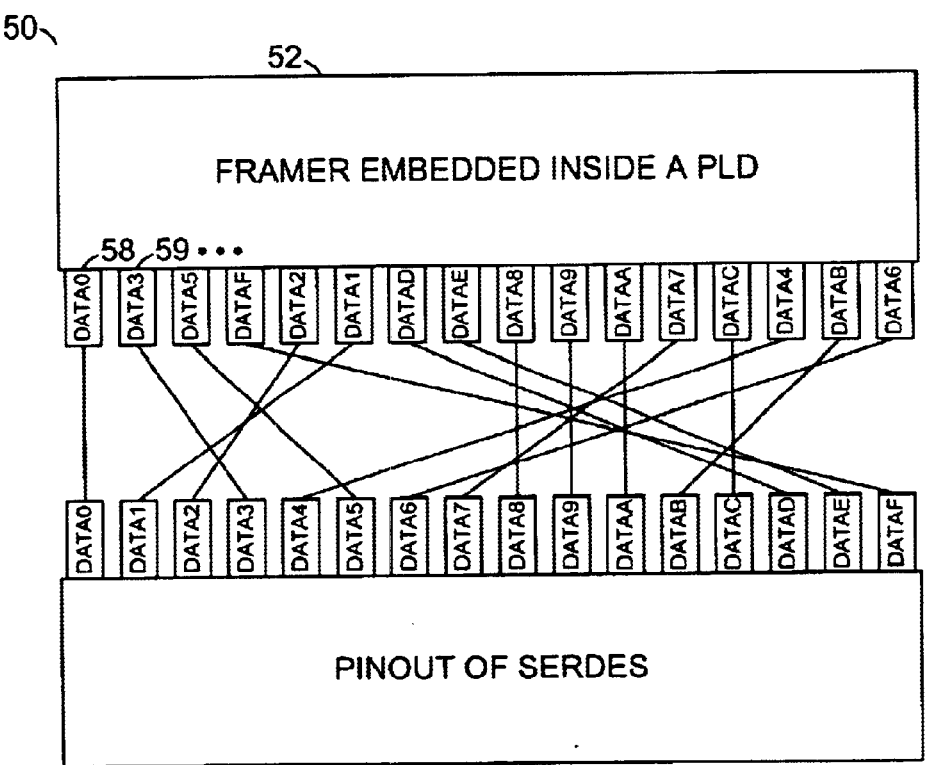
FIG. 5 is a block diagram illustrating an undesired interface I/O mapping.
Figure 6:
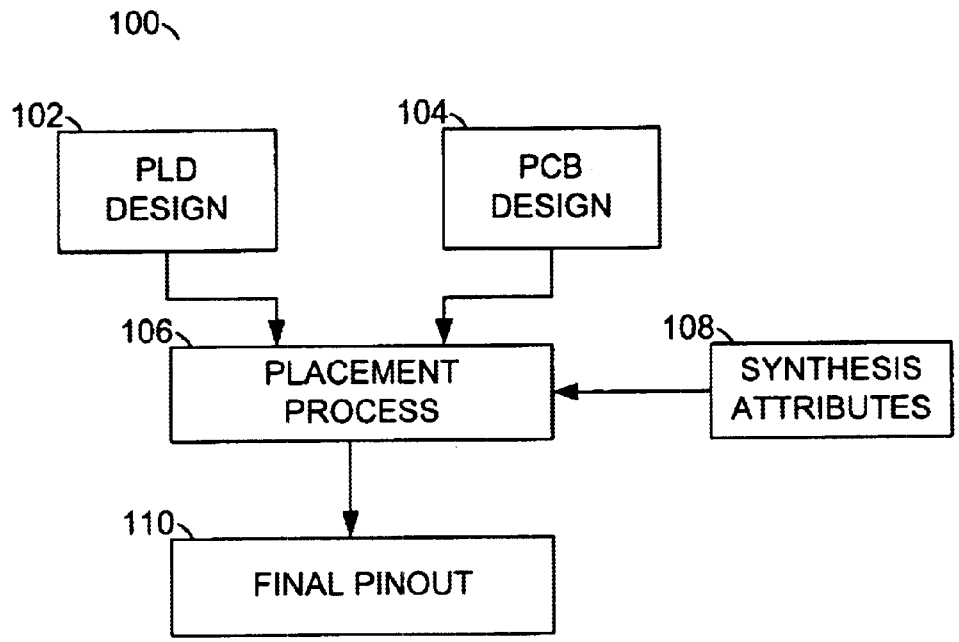
FIG. 6 is a flow chart illustrating a preferred embodiment of the present invention.

Referring to FIG. 6, a flow chart of a method (or process) 100 in accordance with a preferred embodiment of the present invention is shown. The process 100 may illustrate bus I/O pin placement guidance. The process 100 generally comprises a state 102, a state 104, a state 106, a state 108, and a state 110. While in the state 102, the process 100 may receive a PLD design. The PLD design may be presented to the state 106. The PLD design may be received from the Designer or other appropriate source (e.g., PLD design library files). While in the state 104, the process 100 may receive a PCB design. The PCB design may be presented to the state 106. The PCB design may be received from the Designer or other appropriate source (e.g., PCB design library files). The PLD and PCB designs generally include a number of routing and timing constraints via the respective design criteria.

While in the state 106, the process 100 may also receive a synthesis attribute from the state 108. The synthesis attribute may be received from the Designer or other appropriate source (e.g., product data library files). For example, the synthesis attribute may be input by the Designer or generated by appropriate software. The synthesis attribute may be implemented as one or more unique (e.g., independent) attributes that may control pin placement of a PLD on a PCB. The pinout placement is generally implemented via a multi-bit digital representation during the process 106.

While in the placement process 106, the process 100 may provide automated bus I/O placement guidance for the PLD design. The automated placement may occur in response to the PLD design, the PCB design and the synthesis attribute (to be discussed further in connection with FIG. 7). The process 100 may then continue to the final pinout state 110. While in the final pinout state 110, the process 100 may generate the I/O pinout of the PLD. The state 110 is generally an iterative process. While in the state 110, the process 100 may evaluate one or more timing constraints (e.g., attributes and/or PLD design criteria). The state 110 may begin to evaluate the timing constraints when all of the required inputs have been received. The state 110 may complete the evaluation of the timing constraints when (i) the timing constraints are met (e.g., not exceeded by a predetermined maximum amount) and (ii) architecturally, a functional placement has been generated (e.g., a pinout is generated without any limitations due to a resource that is shared by a group of signals). The state 110 may be configured to optimize the pinout in response to the routing and timing constraints.

Figure 7:
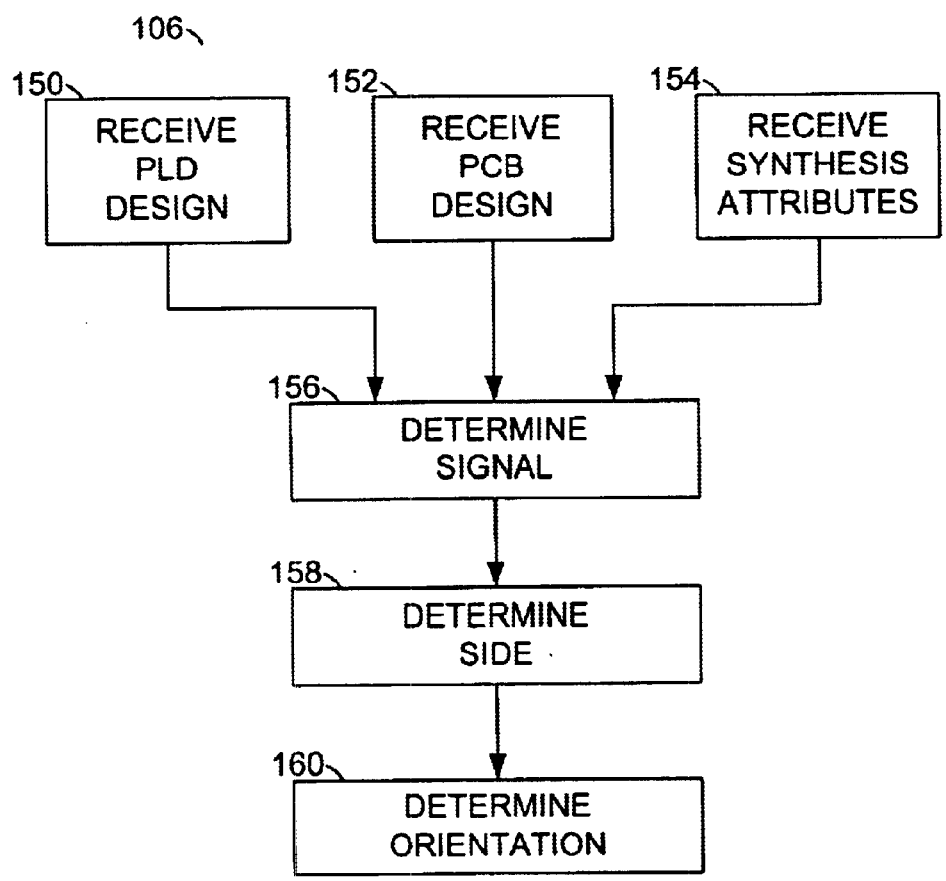
FIG. 7 is a detailed flow chart of the placement process of the present invention.

Referring to FIG. 7, a detailed flow diagram of the placement process state 106 is shown. The placer state 106 may be software, firmware, hardware, or other appropriate type medium and/or routines in order to meet the design criteria of a particular implementation. The state 106 generally comprises a state 150, a state 152, a state 154, a state 156, a state 158, and a state 160. The state 150 may receive the PLD design and present the design to the state 156. The state 152 may receive the PCB design and present the design to the state 156. The state 154 may receive the synthesis attribute(s) and present the attribute(s) to the state 156. For example, the state 154 may determine a bus lock attribute. The state 156 may then determine a type of the signal (e.g., data, chip enable, etc.). For example, the state 156 may determine a data type of signal. A particular type of signal may form a group of signals (e.g., the data signals may form a group)

The state 158 may then determine a side of the PCB pinout. For example, the state 158 may determine a right, left, top or bottom side. The group of signals may be implemented on a same side. The state 160 may then determine an orientation of the pinouts. For example, the state 160 may determine a clockwise (CW) or a counter-clockwise (CCW) configuration for the most significant bit (MSB) of the pinout. The placement constraints determined during the states 156–160 are generally independent. The process state 106 may determine one or more groups of I/O pins in response to the independent placement constraints (e.g., type of signal, side, orientation, etc.), attributes, the PLD design, and/or the PCB design. Any number and/or type of attributes (and/or placement constraints) may be implemented accordingly to meet the design criteria of a particular application. The process 100 generally determines optimal routing for each group independent of the other groups (e.g., independent of the other signal types).

The guidance of the place 106 may occur in the form of the attributes (e.g., the synthesis attribute 108). The method 100 may implement a unique synthesis attribute. For example, the attribute may be as follows:

bus-loc of signal-name: signal is "string ";

The signal name may be a "string ", where the bus-loc may take the value of a string. The string may describe placement guidance within the target device. The format of the string may be as follows:

target side: MSB orientation

The target side may be bottom, right, top, or left and MSB orientation may be clockwise (CW) or counter clockwise (CCW). The method 100 may provide a technique to partially constrain a PLD pinout via the synthesis attribute 108, thereby allowing the Designer to route a PCB with a simple routing technique (e.g., minimizing signal trace crossings and optimizing signal timing). The method 100 may also provide flexibility to the PLD placer 106 in pinout definition.

The method 100 may allow architectural constraints to be overcome automatically. For example, the placer 106 may have flexibility to move I/O pins to ensure architectural limitations are taken into consideration. Since the placer 106 is free to move I/O pins, the placer 106 may arrive at a valid fitting solution if one exists, given the constraints (e.g., the PLD design and the PCB design) imposed by the Designer in response to the attributes.

Figure 8:
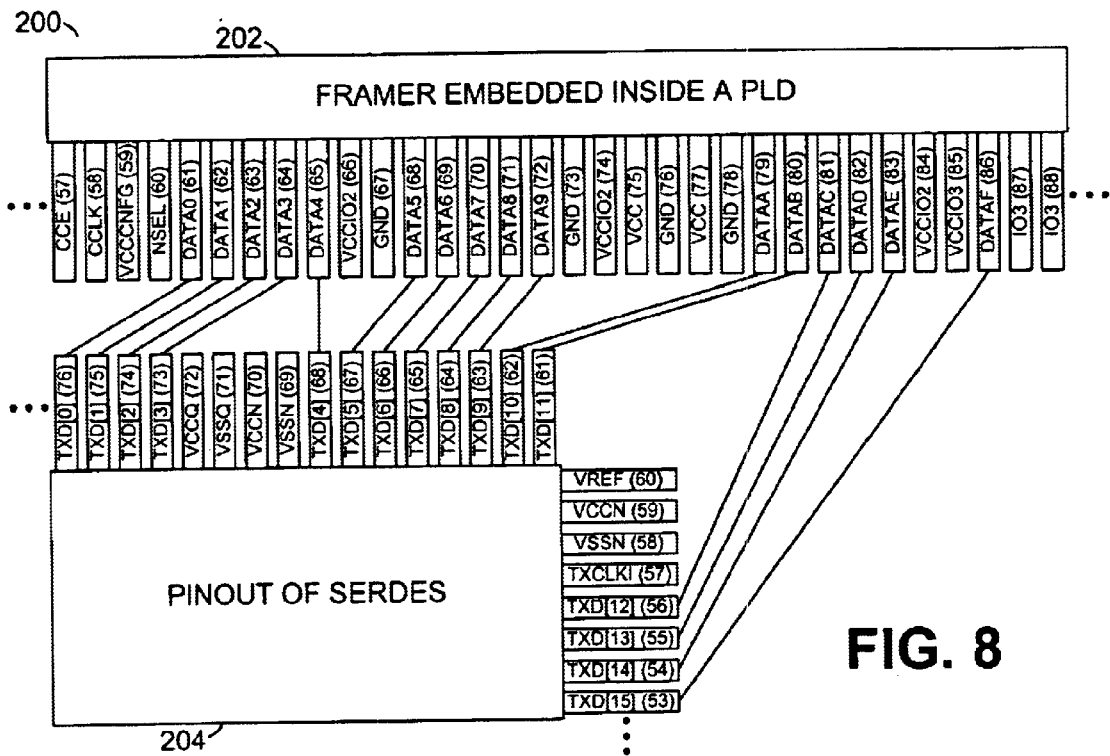
FIG. 8 is a block diagram of a desired pinout in connection with the present invention.
Figure 9:
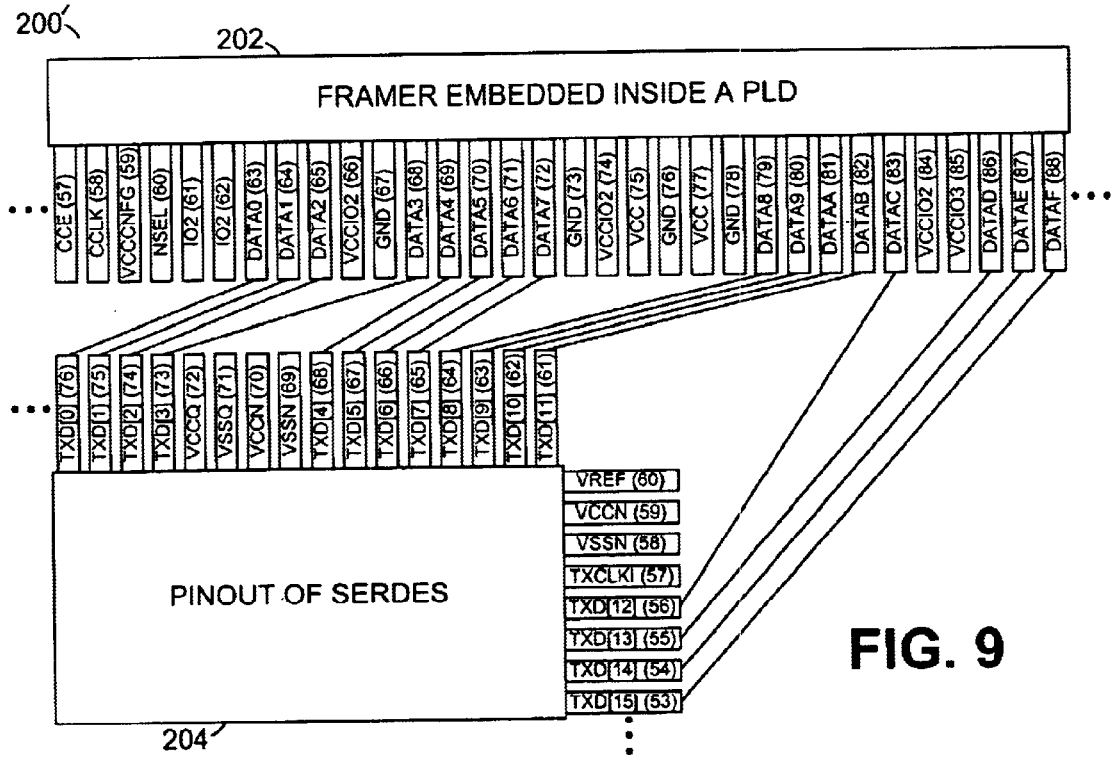
FIG. 9 is a block diagram of an alternative desired pinout in connection with the present invention.

Referring to FIG. 8, an exemplary circuit 200 illustrating a final pinout of the method 100 is shown. The circuit 200 may illustrate the pinout generated by the synthesis attribute guidance of the method 100 (e.g., DATA0(63)–DATA2(65), DATA3 (68), etc.). The circuit 200 may illustrate the routing paths of a framer embedded within a PLD 202 and a serializer/deserializer (SERDES) circuit 204. The circuit 200 may illustrate routing paths that eliminate-crossovers. FIG. 9 may illustrate a circuit 200' with alternate routing paths. The circuit 200' may be similar to the circuit 200. The placer 106 may restrict the placement of the I/O pins of the circuits 200 and 200' to conform to the Designer specified requirements of the synthesis attribute. For the circuits 200 and 200', the synthesis attribute may be as follows:

attribute bus-loc of DATA: signal is "bottom:CCW"

Therefore, the DATA I/O pins may be placed at the bottom of the PLD 202 and the MSB may be counter-clockwise relative to the other pins. The placer 106 may also ensure the I/O pins are placed contiguously subject to the distribution of the non-I/O pins among the I/O pins. The placer 106 may also adhere to the orientation specified by the Designer by placing the MSB of the attribute DATA in the most counter-clockwise position.

The process 100 may allow PCB routing to be simplified. The process 100 may allow the Designer to ensure the routing of the PCB design is simple. For example, the process 100 may allow trace crossings (e.g., crossover routing)to be reduced or eliminated, since the guidance of the pin placement may force the bus I/O pins together (e.g., the 7th signal of the bus may be between the 6th and the 8th signals). The process 100 may be implemented as a method for relative I/O pin placement guidance.

The process 100 may allow timing to be optimized. The method 100 may allow timing requirements and PCB routing requirements to be easily met, since the Designer may be removed from a manually iterative loop. For example, a software utility, such as I/O placer software may be able to iterate through multiple I/O placement options faster than a human can edit the pin definition and recompile a PLD design. Therefore, the Designer may not need to iterate through many pinouts to find a pinout that meets timing and placement requirements. The I/O placement method 100 may allow software to use the synthesis attribute as a constraint. The I/O placer software 106 may be free to attempt to meet both timing constraints and architecture constraints. The method 100 may also allow the placer software 106 to separate Designer constraints from I/O architecture limitations (e.g., a limited number of output-enable (OE) conditions, banked resources (I/O flip-flop asynchronous reset/preset), etc.). The method 100 may also allow the Designer to receive the benefit of a timing-aware placer, while still specifying a form of pin constraint to aid in PCB routing. The placer 106 may need to be timing-aware in order to achieve timing benefit.

The method 100 may be configured to optimize PCB routability by (i) defining a set of I/O pins as a group, (ii) defining independent placement constraints on each group, (iii) routing all input within the group based on the constraints defined for that group, and/or (iv) routing the group independently of signals outside the group.

The method 100 may provide automatic iteration over multiple PCB routability placements for both standard packages with pins distributed on the package perimeter and ball grid array/fine ball grid array (BGA/FBGA) packages to meet timing constraints. The method 100 may provide soft placement guidance to an I/O placer. The method 100 may specify soft placement guidance to an I/O placer. Specifying an intermediate level of I/O constraint via the attribute may allow the method 100 to provide (i) simpler PLD design, (ii) reduced cycle time, since the PLD Designer does not have to manually iterate, (iii) reduced development costs, since the PLD Designer does not have to take the time to manually iterate, (iv) earlier market availability, since the design phase may be shortened, (v) reduce time "tweaking" the design, since the design may meet both timing and PCB routing criteria, (vi) reduce the PCB design cost, since the PCB Designer may not have to route a complicated bus with multiple crossovers, and/or (vii) a more reliable design, since the additional intelligence in the placer 106 may allow the software to optimize for both timing and routing criteria simultaneously.

In another example, the method 100 may allow ASIC layout tools to be improved (e.g., pad placement for buses on an ASIC). The method 100 may also be extended beyond buses (e.g., group a collection of signals together and specify the order in which they should be placed: A, B, C, D, etc. rather than any arbitrary distribution).

The function performed by the flow diagrams of FIGS. 6 and 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for relative pin placement guidance, comprising the steps of:
    (A) placing a plurality of pins to form a pinout in response to a first design for a programmable logic device, a second design for a printed circuit board and an attribute; and
    (B) determining one or more placement constraints, one or more groups of said pins and routing of said pins in response to said attribute.

2. The method according to claim 1, wherein each of said groups carries a particular signal type.

3. The method according to claim 1, wherein each of said groups has an independent placement constraint of said one or more placement constraints different than said one or more placement constraints of other said groups.

4. The method according to claim 3, wherein step (B) further comprises:
    determining said independent placement constraint in response to said attribute.

5. The method according to claim 1, wherein step (A) further comprises:
    providing flexible placement of said pins.

6. The method according to claim 1, wherein step (A) further comprises:
    routing said pins in response to said one or more placement constraints defined for said group.

7. The method according to claim 1, wherein step (B) further comprises:
    evaluating one or more timing constraints.

8. The method according to claim 7, wherein step (B) further comprises:
    determining signal types of said pinout.

9. The method according to claim 8, wherein step (B) further comprises:
    determining a side of said pinout.

10. The method according to claim 9, wherein step (B) further comprises:
    determining an orientation of said pinout.

11. The method according to claim 1, wherein step (B) further comprises:
    simplifying routing of said pins on said printed circuit board.

12. The method according to claim 1, wherein step (B) further comprises:
    optimizing signal timing on said printed circuit board for said pins.

13. The method according to claim 1, wherein step (B) further comprises:
    determining one or more architectural constraints of said programmable logic device.

14. The method according to claim 7, wherein step (B) further comprises:
    completing said evaluating when said one or more timing constraints are less than a predetermined maximum amount.

15. The method according to claim 8, wherein said signal types are signals selected from a group consisting of data signals and chip enable signals.

16. The method according to claim 9, wherein said side is selected from a group consisting of right side, left side, top side and bottom side.

17. The method according to claim 10, wherein said orientation is selected from a group consisting of clockwise and counter clockwise.

18. An apparatus configured to execute one or more sets of computer executable instructions for performing the steps for relative pin placement guidance, wherein said steps comprise:
    (A) placing a plurality of pins to form a pinout in response to a first design for a programmable logic device, a second design for a printed circuit board and an attribute; and
    (B) determining one or more placement constraints, one or more groups of said pins and routing paths between said pins in response to said attribute for (i) reducing or eliminating (a) crossover routing on said printed circuit board and (b) manual iterations of said pinout and (ii) meeting said placement constraints and one or more timing constraints through said pinout.

19. A computer readable medium containing one or more sets of computer executable instructions for performing the steps for relative pin placement guidance, wherein said steps comprise:
    (A) placing a plurality of pins to form a pinout in response to a first design for a programmable logic device, a second design for a printed circuit board and an attribute; and
    (B) determining one or more placement constraints, one or more groups of said pins and routing paths between said pins in response to said attribute for (i) reducing or eliminating (a) crossover routing on said printed circuit board and (b) manual iterations of said pinout and (ii) meeting said placement constraints and one or more timing constraints through said pinout.

* * * * *